US010212515B2

(12) United States Patent
Gaviot et al.

(10) Patent No.: US 10,212,515 B2
(45) Date of Patent: Feb. 19, 2019

(54) DEVICE AND METHOD FOR FILTERING THE RESONANCE PEAK IN A POWER SUPPLY CIRCUIT OF AT LEAST ONE LOUDSPEAKER

(71) Applicants: WHYLOT SAS, Cambes (FR); UNIVERSITE DU MAINE, Le Mans (FR); CNRS, Paris (FR)

(72) Inventors: Etienne Gaviot, Le Mans (FR); Mehran Erza, Le Mans (FR); Frédéric Polet, Le Mans (FR); Lionel Camberlain, Le Mans (FR); Romain Ravaud, Corn (FR)

( * ) Notice: Subject to any disclaimer, the term of this patent is extended or adjusted under 35 U.S.C. 154(b) by 121 days.

(21) Appl. No.: 15/127,884

(22) PCT Filed: Mar. 3, 2015

(86) PCT No.: PCT/FR2015/000048
§ 371 (c)(1),
(2) Date: Apr. 17, 2017

(87) PCT Pub. No.: WO2015/132486
PCT Pub. Date: Sep. 11, 2015

(65) Prior Publication Data

US 2017/0303038 A1 Oct. 19, 2017

(30) Foreign Application Priority Data

Mar. 4, 2014 (FR) .................................... 14 00569

(51) Int. Cl.
*H04R 3/04* (2006.01)
*H03G 5/00* (2006.01)
*H04R 3/02* (2006.01)
*H04R 3/08* (2006.01)
*H04R 3/00* (2006.01)

(52) U.S. Cl.
CPC .............. *H04R 3/02* (2013.01); *H04R 3/002* (2013.01); *H04R 3/08* (2013.01)

(58) Field of Classification Search
CPC .............................. H04R 3/14; H04S 2400/01
USPC ................................ 381/59, 96, 98–99, 111
See application file for complete search history.

(56) References Cited

U.S. PATENT DOCUMENTS

2014/0219480 A1* 8/2014 Collins .................. H04R 3/14 381/300

* cited by examiner

*Primary Examiner* — George C Monikang
(74) *Attorney, Agent, or Firm* — Vincent G. LoTempio; Kloss, Stenger, Lotempio; Phillip B. Abramowitz

(57) ABSTRACT

The present invention relates to an acoustic signal supply circuit of at least one loudspeaker (HP) incorporating a filtering device of the resonance peak of said at least one loudspeaker (HP) occurring at a given frequency, characterized in that the filtering device of the resonance peak of said at least one loudspeaker (HP) is incorporated either into the first instrumentation ground circuit or in the feedback loop, this filtering device being purely electrical in the form an impedance incorporated in the first instrumentation ground circuit or in the feedback loop, the impedance parameters being predetermined as a function of the resonance peak to be filtered of said at least one loudspeaker (HP).

7 Claims, 5 Drawing Sheets

Figure 1:
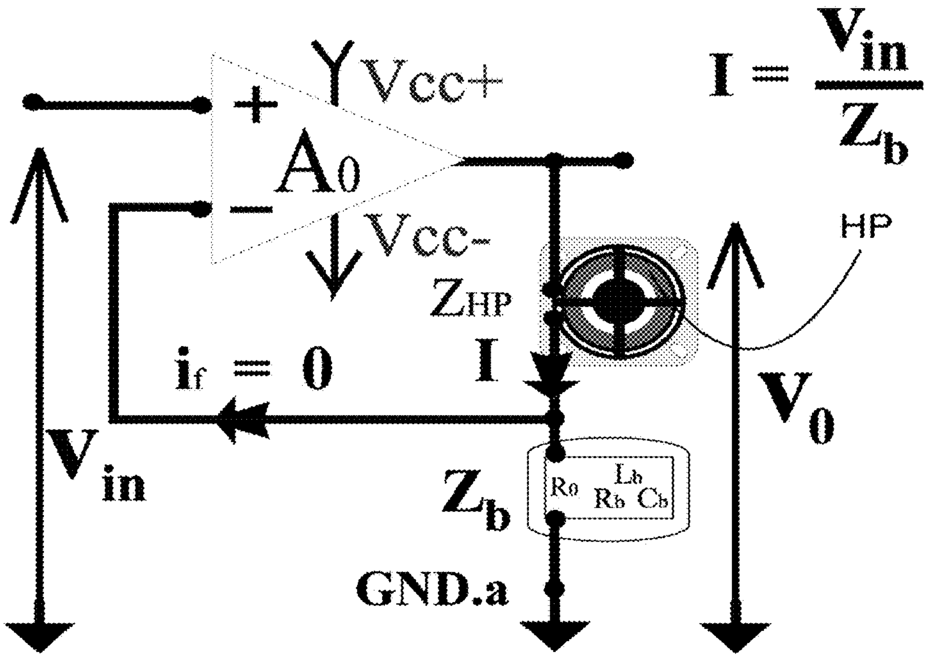

DEVICE AND METHOD FOR FILTERING THE RESONANCE PEAK IN A POWER SUPPLY CIRCUIT OF AT LEAST ONE LOUDSPEAKER

The present invention relates to a device and a filtering method of the resonance peak in a power supply circuit of at least one loudspeaker.

It is known that a conventional loudspeaker includes an electromagnetic actuator, usually composed of a coil disposed on a movable assembly within a magnetic field generated by a permanent magnet.

When the coil of the loudspeaker is traversed by a frequency-modulated current, the mechanical displacement induced at audio frequency is converted into an acoustic field by means of a membrane acting as the emitting surface, also called acoustic radiator.

The sound quality of the loudspeaker depends on the frequency response curve, i.e. a mechanical acceleration response to an electrical load either or of current or voltage, which is sought to be as constant as possible throughout the entire bandwidth. The sound quality also depends on the linearity of the device characterized by the presence of a minimum of harmonic distortions and intermodulations.

If the transducer acting as loudspeaker promotes all frequencies equally, reproduction of the timbre of a musical instrument, constitutive of useful sound harmonics, appears prima facie to be ensured.

However, the reality is more complex in view of the need to properly reproduce attack transients of representative sounds of the acoustic signature of quality instruments. The response of the loudspeaker to the transients is an essential condition of "fidelity" that can be tested by detecting the "smearing" of the membrane when the loudspeaker is solicited by a pulse train. The inertia of the mobile assembly and the forces due to self-induction phenomena participate in this defect.

Acoustic, optical and electrical measurements show that there is no ideal loudspeaker and that each implementation is flawed in terms of bandwidth limitation, various resonance peaks and inertia. The coupling of several transducers allows in principle to overcome many shortcomings, but, conversely, it sometimes happens that the shortcomings adversely cumulate for a quality musical reproduction.

In a loudspeaker, the useful driving force at the origin of the displacement of the mobile assembly results from the interaction of the magnetic induction field, denoted B, with each element of length of the winding traversed by a current denoted i(t) function of a time t. At the local level, the elemental force applied to a load carrier in displacement within an induction field is called a Lorentz force and is exerted in a direction perpendicular to the plane defined by the scope and speed of the carriers. A record within a load carrier elementary volume subject to the phenomenon leads to the expression:

$$F=i\cdot\int_0^l\vec{B}\cdot\vec{dl}=B\cdot l\cdot i \quad (1)$$

Everything occurs as if the unwound length of the winding, denoted l, was exposed to a homogeneous magnetic induction field, which allows defining the amount Bl=B·l called power factor (in Newton per amp or in Tesla.meter) of the mobile part of the loudspeaker.

This force modulated by the intensity, solicits the mobile assembly whose mechanical behavior is dictated by three components: a force of inertia, product of the mass of the moving parts denoted $M_m$ by the imposed acceleration, a force of damping, generally assumed to be proportional to the displacement speed through a constant denoted $f_m$ in Newton/m/s or kg/s, and a restoring force linked to the mechanical suspension affected by a stiffness denoted $k_m$ in N/m. For a guided translation on an x axis, the behavioral equation of such idealized transducer is:

$$F=B_l\cdot i=M_m\cdot\frac{d^2x}{dt}+f_m\cdot\frac{dx}{dt}+k_m\cdot x \quad (2)$$

The current-voltage relationship at the terminals of the loudspeaker is governed by its structure characterized by the mobile assembly moving within a magnetic field. Thus, the electrical behavior is dictated by two mechanisms, namely the dissipation by Joule effect related to the Ohm's law and electromagnetic interactions in terms of induced electromotive forces, subtended by three contributions:

- the voltage drop related to the resistive component of the assembly solenoid winding,
- the induced electromotive force related to the variation in magnetic flux during displacement,
- the self-induction electromotive force governed by the law of Lenz.

Thus, assuming system linearity, an electric behavioral equation is added to the aforesaid equation governing the mechanical behavior of the loudspeaker:

$$e_{(t)}=R_e\cdot i_{(t)}+L_e\cdot\frac{di}{dt}+B_l\cdot\frac{dx}{dt} \quad (3)$$

In which $R_e$ is the pure resistive component of the winding, likely to vary with the temperature measured in ohms, and $L_e$ the sound inductor proper, function of the displacement measured in Henry when taking into account the nonlinearities. In fact, if the current involved in the left-hand side of the second equation follows directly from the third equation, then any disruption or non-linearity involved in the latter causes an influence on the displacement of the membrane and its derived functions.

There are two respective strategies for controlling a loudspeaker, namely a current control or a voltage control. If, in both cases, the signal processing by the stages of preamplification leads to a consistently measurable control signal as a voltage, in the case of a voltage control, it is naturally dependent on the impedance of the dipole that the transducer represents when acting as loudspeaker. This control is similar to a bond between Thevenin ideal generators capable of supplying to the loudspeaker. The loudspeaker then constitutes a tributary load of an almost zero impedance power supply and any electromotive force or EMF component generated directly influences the current flowing through the association.

Conversely, for a current control, the current-voltage transduction is provided by a specifically designed signal conditioner, the transducer being solicited by the output current of this conditioner. This control is similar to a Norton ideal generator capable of supplying to the transducer: the latter represents then a load solicited under infinite impedance on which any EMF fluctuation generated by the load remains without consequences on the behavior of the association. Better yet, this voltage can be measured then used as correction signal in a servoing strategy.

Generally, control by voltage directly solicits loudspeakers given an electrical behavior subjected to the constituent parameters of its impedance. It is only relatively recently that various works were conducted for the design of loudspeakers specifically electrically controlled, given adequate conditioners.

Among electrical and mechanical parameters representative of the behavior of a loudspeaker, the three magnitudes, Bl, $R_e$, $L_e$ aforementioned fundamentally determine the quality of reproduction of the conditioner-transducer association. Interactions will not be the same depending on the choice made by the designer between the two control modes in current and voltage.

With a current control, the conditioner-transducer association remains by nature totally immune to the tensions generated. For such a choice, however, it is necessary to detect and correct, if possible, the defects inherent in the alteration of the parameters involved in equation (2) which in fact presents a force of parasite-term function of the intensity squared or $i^2$ called solenoid according to the formula:

$$B_l \cdot i + \frac{1}{2} \cdot i^2 \cdot \frac{dL_e}{dx} = M_m \cdot \frac{d^2x}{dt^2} + f_m \cdot \frac{dx}{dt} + k_m \cdot x \tag{4}$$

Equation (2) can be written in the frequency domain by:

$$B_l \cdot I = M_m \cdot p^2 \cdot X + f_m \cdot p \cdot X + k_m \cdot X = M_m \cdot \left[p^2 + \frac{f_m}{M_m} \cdot p + \frac{k_m}{M_m}\right] \cdot X \tag{5}$$

where X is the transform of the displacement according to Laplace and I is I times the unit, the $f_m$:$M_m$ ratio being representative of the attenuation which is the reverse function of the relaxation time, while $k_m/M_m$ translates the square of the resonance angular frequency.

By denoting $f_m/M_m=2/\tau$ and $k_m/M_m=\omega_0^2$, $\omega_0$ being the initial angular speed, the transfer function of the displacement applied to the current is expressed:

$$\frac{X}{I} = \frac{B_l}{M_m} \cdot \frac{1}{\left(p^2 + \frac{2}{\tau} \cdot p + \omega_0^2\right)} = \frac{B_l}{M_m} \cdot \frac{1}{(p-a) \cdot (p-b)} = \frac{B_l}{M_m} \cdot \frac{1}{P_1} \tag{6}$$

Equations (2) and (3) may be considered in the frequency domain in harmonic regime and combined therebetween in terms of the cascaded transfer functions. By denoting $E_0$ and $I_0$ the decoupled complex magnitudes of their evolutionary part, the index being indicative of a particular angular frequency also called "phasors", we obtain:

$$E_0 = I_0 \cdot (R_e + L_e \cdot p) + B_l \cdot (X \cdot p)$$

$$B_l \cdot I_0 = M_m \cdot p \cdot (p \cdot X) + f_m \cdot (p \cdot X) + \frac{k_m}{p} \cdot (p \cdot X)$$

so it $$(p \cdot X) = B_l \cdot I_0 \Big/ \left[M_m \cdot p + f_m + \frac{k_m}{p}\right]$$

After substituting product p.X in the first relationship, the impedance transfer function appears immediately in a composite form involving two terms:

$$\frac{E_0}{I_0} = Z_{HP} = (R_e + L_e \cdot p) + \frac{B_l^2}{M_m} \cdot \frac{p}{\left(p^2 + \frac{f_m}{M_m} \cdot p + \frac{k_m}{M_m}\right)} \tag{7}$$

If the reactance component is neglected, then the impedance of the loud loudspeaker can be written:

$$Z_{HP} \approx R_e + \frac{B_l^2}{M_m} \cdot \frac{p}{P_1} = \frac{R_e \cdot M_m \cdot P_1 + B_l^2 \cdot p}{M_m \cdot P_1} \tag{7a}$$

Grouping the parameters then leads to the following simple form:

$$\left[\frac{X}{E}\right]_p = \frac{B_l}{M_m \cdot R_e} \cdot \frac{1}{\left[p^2 + \left(\frac{f_m + B_l^2/R_e}{M_m}\right) \cdot p + \omega_0^2\right]} = \frac{B_l}{M_m \cdot R_e} \cdot \frac{1}{V_1} \tag{7b}$$

It is immediately apparent that the polynomial $V_1$ which is the one representative of the voltage control-related behavior is characterized by a damping a fortiori greater than that of the polynomial $P_1$ associated with the current control regime. To the viscous friction coefficient $f_m$ of a current control regime is substituted, for a voltage control regime, a systematically increased coefficient such as:

$$f_{m+e}=(f_m+B_l^2/R_e)>f_m \tag{8}$$

With regard to the times proper respectively involved ($\tau_m$ and $\tau_{m+e}$), mechanical resonance factor $Q_m$ and $Q_{m+e}$, are defined as:

$$Q_m = \frac{\omega_0 \cdot \tau_m}{2} = \frac{\sqrt{k_m \cdot M_m}}{f_m} \tag{9 and 9a}$$

and $$Q_{m+e} = \frac{\omega_0 \cdot \tau_{m+e}}{2} = \frac{\sqrt{k_m \cdot M_m}}{f_m + B_l^2/R_e}$$

A specifically electric coefficient $Q_e$ can thus be defined by letting $f_m$ tend towards zero and a simple relationship coupling the resonance factors can then be written:

$$\frac{1}{Q_{m+e}} = \frac{1}{Q_m} + \frac{1}{Q_e} \tag{10}$$

The impedance of the transducer combines an exclusively electric component with a second component called motional impedance. Thus, the loudspeaker impedance $Z_{HP}$ is written $Z_{HP}=Z_e+Z_m$ with:

$$Z_e = (R_e + L_e \cdot p), \tag{11, 11a}$$

*et*

$$Z_m = \frac{B_l^2}{M_m} \cdot \frac{p}{\left(p^2 + \frac{f_m}{M_m} \cdot p + \frac{k_m}{M_m}\right)} = \frac{B_l^2}{M_m} \cdot \frac{p}{P_1}$$

It appears that the motional impedance is affected by a characteristic polynomial of order two showing a band-pass type behavior. In addition, if it is customary to designate the nominal impedance value by a given value, often 4 W and 8 W often for power transducers, 16 W and 32 W for mini and microsystems equipping helmets, the contribution of the motional impedance is by no means negligible when the transducer must be applied voltage. Similarly, when the frequency increases, the inductive reactance component j·L·w progressively attenuates the reproduction of signals.

The behavior of a transducer when applied voltage shows the coupling of relationships 8 and 9b associated in terms of composite transfer functions. Considering here the relative displacement function X(p), resuming the previous notation of equation (6):

$$\left[\frac{X}{I}\right]_p = \frac{B_l}{M_m}\cdot\frac{1}{P_1} avec\ P_1 = \left(p^2 + \frac{2}{\tau}\cdot p + \omega_0^2\right)$$

Equation (11) descriptive of the impedance of the transducer results in addition:

$$\left[\frac{X}{E}\right]_p = \left[\frac{X}{I}\right]_p \cdot \left[\frac{I}{E}\right]_p = \frac{B_l}{M_m}\cdot\frac{1}{P_1}\cdot\frac{1}{Z_{HP}} \quad (12)$$

As a result, the transfer functions of the speed of the diaphragm and the acceleration, in terms of derived magnitudes, are then expressed in two equations:

$$\left[\frac{V}{E}\right]_p = \frac{B_l}{M_m}\cdot\frac{p}{P_1}\cdot\frac{1}{Z_{HP}} \quad (12\ \&\ 12a)$$

*et*

$$\left[\frac{A}{E}\right]_p = \frac{B_l}{M_m}\cdot\frac{p^2}{P_1}\cdot\frac{1}{Z_{HP}}$$

If we consider the function related to the displacement, it can be expressed generally as follows:

$$\left[\frac{X}{E}\right]_p = \frac{B_l}{M_m}\cdot\frac{1}{P_1}\cdot\frac{1}{Z_{HP}} = \frac{B_l}{M_m}\cdot\frac{1}{P_1}\cdot\frac{1}{(R_e + L_e\cdot p) + \frac{B_l^2}{M_m}\cdot\frac{p}{P_1}} \quad (13)$$

An important consequence of this writing appears immediately, when looking at close regimes of resonance, with the need for a correction by filtering in the case of current control. The voltage control allows for its part to enjoy a significant advantage, often cited as the definitive argument justifying that choice, with a natural damping effect much greater than for current control.

Document FR-A-2 422 309 acknowledges in its introduction that for a loudspeaker controlled by current the membrane of the loudspeaker can be the seat of deformations or standing waves at very high frequency, which is particularly disadvantageous for a current control. Conversely, this document recognizes that a voltage control is only usable in a restricted frequency range.

To improve the current control, this document proposes to combine a current control and servo acceleration for the frequency range covering all mechanical resonances of the loudspeaker. However, this solution has never been satisfactory because servo acceleration has not been able to compensate all mechanical resonances specific to each loudspeaker.

Document GB-A-2 473 921 discloses in its introduction that the sound quality of electrodynamic loudspeakers can be significantly improved by supplying a loudspeaker with a current control instead of the voltage control frequently adopted. The current control is obtained when the source impedance seen by the driver is high compared to the impedance of the driver itself.

This document also recognizes that, in current control, a typical peak frequency of an uprising of a loudspeaker in the shape of a cone cannot be compensated by simply adding an RC network in parallel with the driver, the high impedance of the source being then lost.

This document therefore provides a control of the loudspeaker with a double coil used in conjunction with an impedance which disables one of the voice coils at high frequencies, producing the correction of the required response while retaining a relatively high impedance of the source.

The addition of a dual coil, however, requires a complete reconstruction of the control coil in current which is not usually twofold. This presents a cost prohibitive and design specific arrangements for the current control.

Esa Meriläinen's document titled "Current-driving of loudspeakers—Eliminating major distortion and interference effects by the physically correct operation method" dated Feb. 8, 2010, USA, ISBN: 1450544002 represents the closest state of the art. This document discloses an acoustic signal supply circuit of at least one loudspeaker incorporating a filtering device of the resonance peak of said at least one loudspeaker occurring at a given frequency of the supply current of said at least one loudspeaker, said circuit comprising at least a non-inverting converter arranged upstream of said at least one loudspeaker having a positive supply terminal connected to the circuit input supply and a negative supply terminal, said circuit also comprising at the output of said at least one loudspeaker a first instrumentation ground circuit bypassing a feedback loop connecting a point in the circuit downstream of the loudspeaker to the negative supply terminal of the non-inverting converter, the filtering device of the resonance peak of the at least one loudspeaker being purely electrical as an impedance embedded either in the first instrumentation ground circuit or in the feedback loop, the parameters of the impedance being predetermined as a function of the resonance peak to be filtered for said at least one loudspeaker.

According to documents from the state of the aforementioned technique, while the advantages of a current control of a loudspeaker have been recognized, to date no solutions to remedy effectively two endemic major disadvantages of such current control have been developed, namely:

- firstly, the presence of a resonance peak that cannot remain without being corrected, while a voltage control brings precisely a natural correction to this resonance peak thanks to the effects of the motional impedance keyed to the transducer resonant frequency,
- secondly, as the frequency increases, the acoustic studies show an increased directional effect of the loudspeaker leading to a measurable enhancement of the sound level in the axis perpendicular to the diaphragm, this phenomenon being called "horn effect". Again, when using voltage control, the inductive component of the transducer corrects this effect locally before reducing the sound level in the higher frequencies.

The object of the present invention is, for any loudspeaker category, to correct at least the presence of a resonance peak when using current control on a loudspeaker, by electronic means and without any specific adaptation of the current control of the loudspeaker, which remains unchanged from that of the prior art.

To this end, the invention relates to a circuit according to the closest state of the art mentioned above, characterized in that, when the impedance is incorporated into the first instrumentation ground circuit, this impedance is in the form of an off resistor associated with a first parallel impedance called RLC comprising at least one first resistor, at least one first inductor and at least one first capacitor arranged in parallel to each other, the first parallel RLC impedance being arranged in series with the dead resistor in said first instrumentation ground circuit, and when the impedance is incorporated into the feedback loop, this impedance as the second impedance comprises a second resistor coupled in parallel to at least a second inductor and at least a second capacitor, said at least one second inductor and said at least one second capacitor being arranged in series.

The technical effect is to be able to use a current control with the advantages mentioned above while hiding at least the major disadvantage of a current control which is the formation of a resonance peak not compensated by this current control, unlike what occurs with a voltage control.

In the first embodiment of the invention, preferably, the values of said at least one first capacitor, said at least one first resistor and said at least one first inductor are calculated according to the parameters of said at least one loudspeaker, namely the $f_m$:$M_m$ ratio representative of the mitigation and the $k_m$:$M_m$ ratio representative of the square of the resonance angular frequency of the at least one loudspeaker according to the following equations:

$$f_m/M_m = 1/R_b \cdot C_b$$

$$k_m/M_m = 1/L_b \cdot C_b$$

Advantageously, the dead resistor value is calculated using the following equation:

$$R_0 = \frac{1}{C_b} \cdot \frac{1}{\sqrt{2 \cdot k_m / M_M} - f_m / M_m}$$

Advantageously, the first parallel RLC impedance comprises n first inductors and the first n capacitors, n being greater than or equal to one.

In the second embodiment of the invention, advantageously, a second instrumentation ground circuit is arranged between the second impedance and the converter, the first and second instrumentation ground circuits respectively including a first dead resistor for the first instrumentation ground circuit and a second dead resistor for the second instrumentation ground circuit.

Advantageously, a calibration of the device is made according to the value of the first off resistor, the value of the second resistor of the second impedance being determined by the value of the first dead resistor by being 10 to 100 times greater than the value of the first off resistor, the value of the second dead resistor being 2 to 30 times greater than the value of the first off resistor.

Advantageously, when the value of said at least one second inductor exceeds a value of 50 mH, said at least one second inductor is in the form of virtual chokes provided with gyrating means.

For both embodiments mentioned above, the impedance used in the filtering device may consist, at least partly, of virtual elements, including at least one virtual inductor. Such virtual impedance, preferably a virtual inductor, can be particularly beneficial because it can be easily changed without replacing the elements thereof but only by modifying their interaction and/or operation. Such virtual impedance thus offers the great advantage of an easy adaptation to operating conditions of said at least one loudspeaker, including, but not limited to, monitoring a variation in the frequency of the resonance peak due, for example, to a variation of temperature of said at least one loudspeaker or against loudspeaker overheating.

The invention also relates to a current control method of an acoustic signal supply circuit of at least one loudspeaker, incorporating such a filtering device of the resonance peak of said at least one loudspeaker, in which method a correction step of the resonance peak by the filtering device is carried out, said correction step being carried out downstream of said at least one loudspeaker.

Advantageously, the overall resonance factor of the loudspeaker and the filtering device is set to a Butterworth filter.

Advantageously, said at least one loudspeaker having a diaphragm, filtering the resonance peak to a reduction in the sound level in the higher frequency in the direction of the axis perpendicular to the diaphragm of said at least one loudspeaker is carried out simultaneously.

Advantageously, the reduction of the sound level takes place upstream of said at least one loudspeaker. Thus, one can combine a reduction in resonance peak downstream of the at least one loudspeaker with a reduced sound level upstream of said at least one loudspeaker.

Advantageously, the temperature variations of said at least one loudspeaker are taken into account by the filtering device by variation in correspondence of the parameters of the impedance of said device. This can compensate the fact that a current control does not regulate possible overheating of said at least one loudspeaker, as opposed to a voltage control.

This allows compensating for a disadvantage in addition to the two disadvantages mentioned above, namely the formation of an uncompensated resonance peak and the increase of the sound level in the higher frequencies in the direction of the axis perpendicular to the diaphragm of said at least one loudspeaker. In addition, the frequency of the resonance peak may vary with a temperature change of said at least one loudspeaker. It is therefore appropriate and advantageous to take temperature variations of the at least one loudspeaker into account, especially when correcting the resonance peak, so that this correction is as accurate as possible.

All this can be compensated by changing the parameters of the impedance of the filtering device, in particular the inductor which may be a virtual inductor. In this case, taking into account the temperature of the loudspeaker, which can be either measured or estimated, is performed automatically through respective modification of the various elements that make up the virtual inductor, for example, but not limited to, the auxiliary converters.

Figure 2:
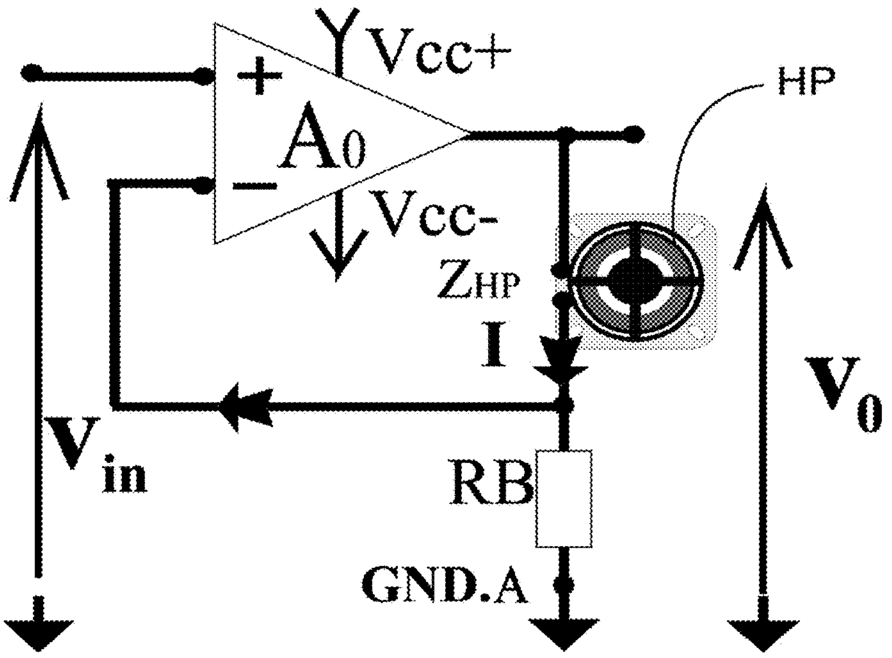
Figure 3:
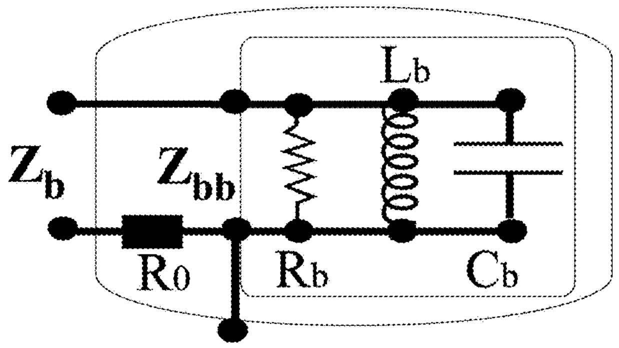
Figure 4:
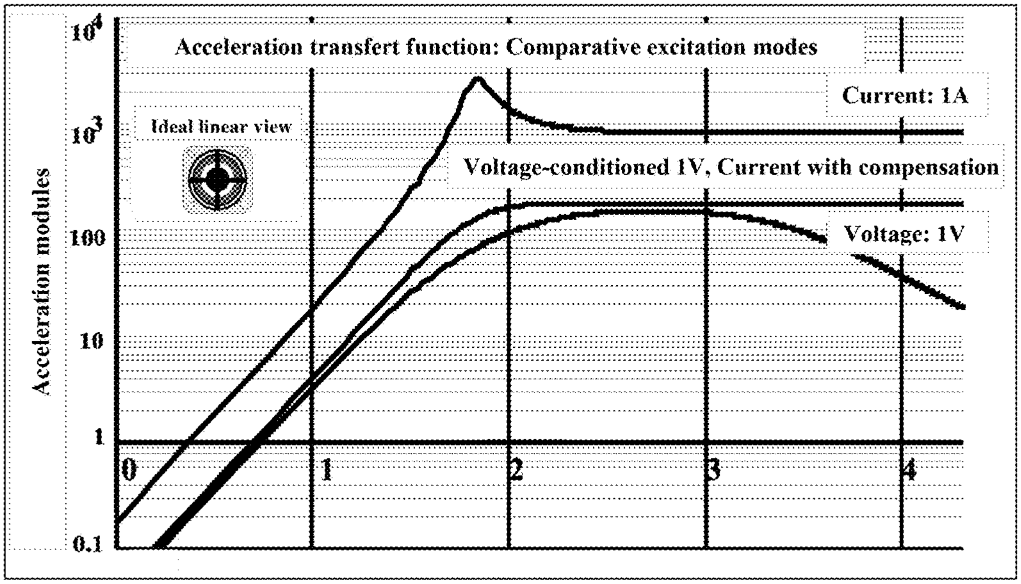
Figure 5:
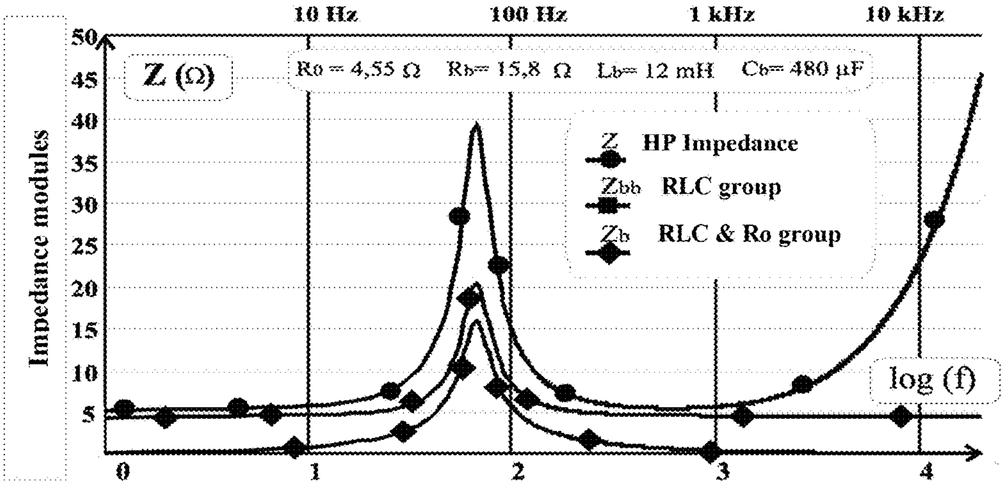
Figure 5A:
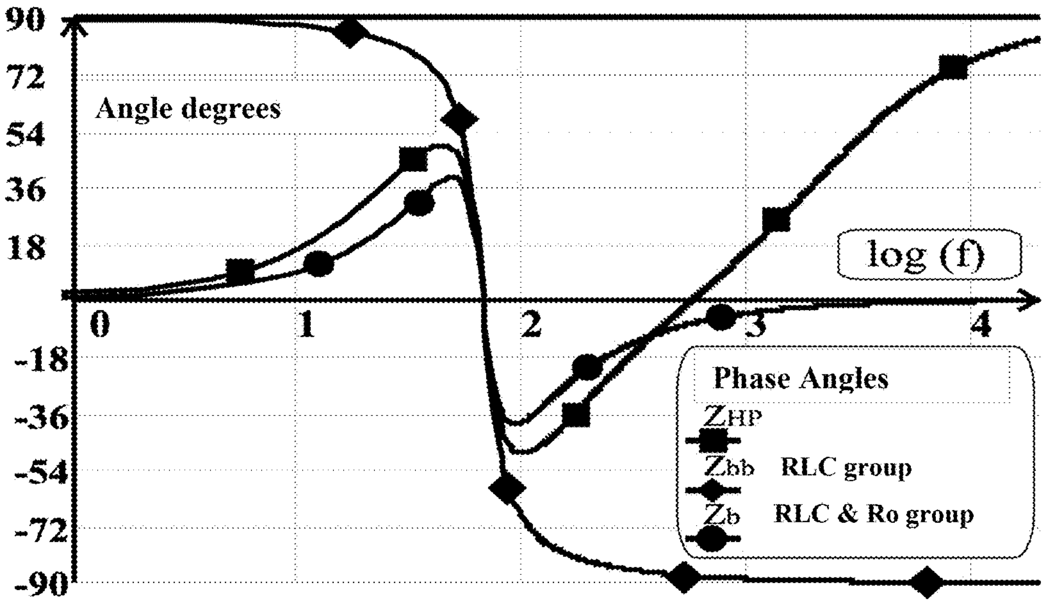
Figure 6:
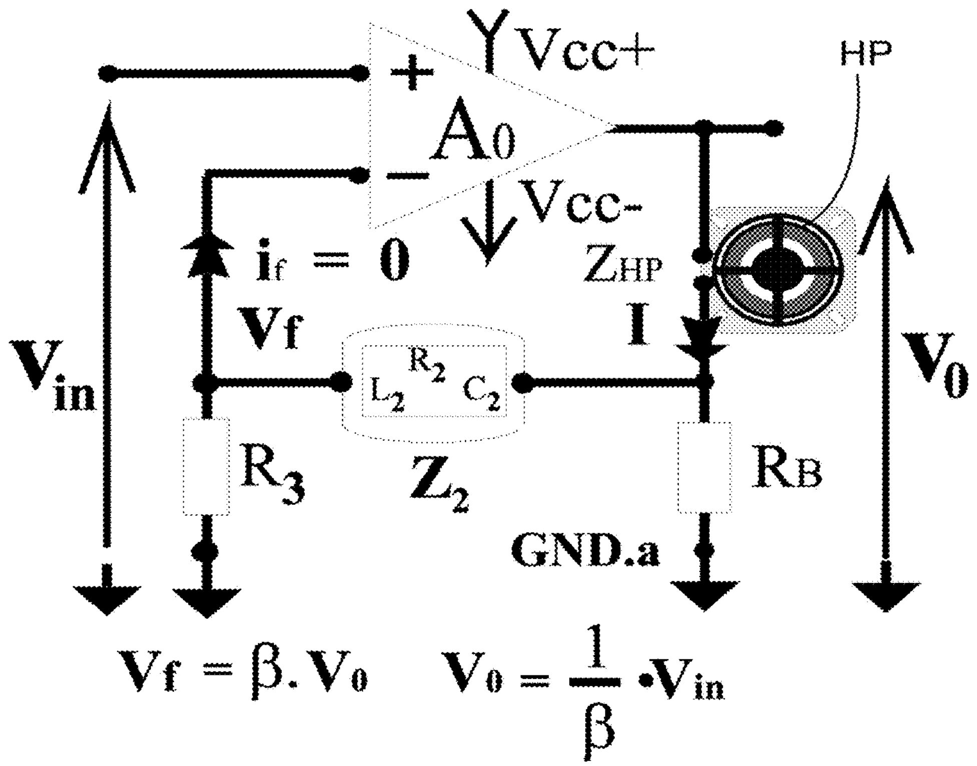
Figure 7:
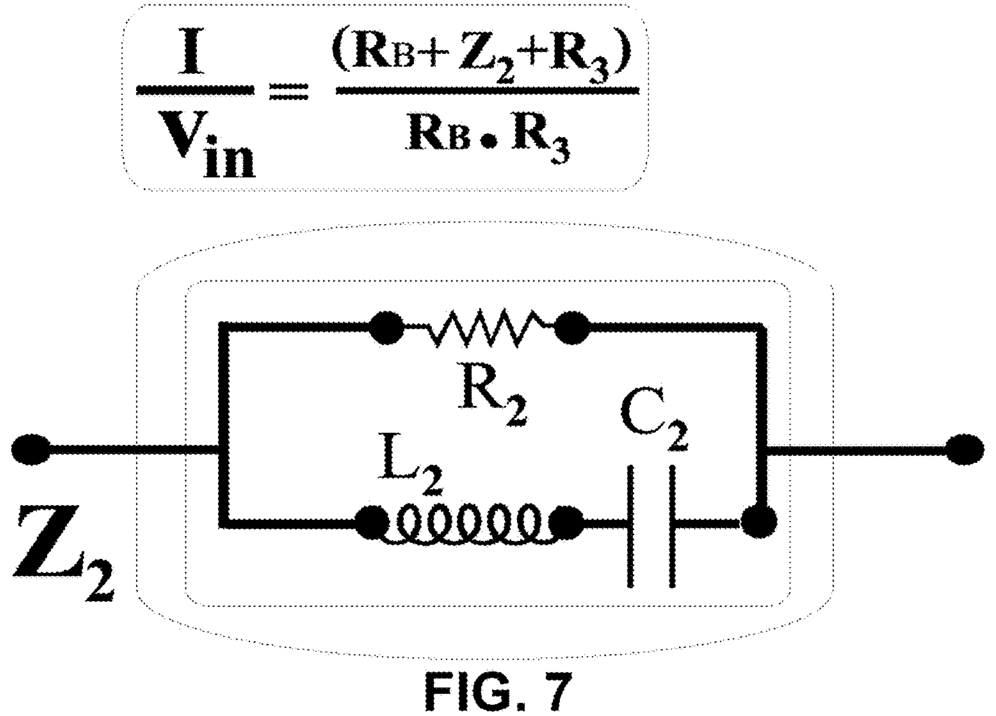
Figure 8:
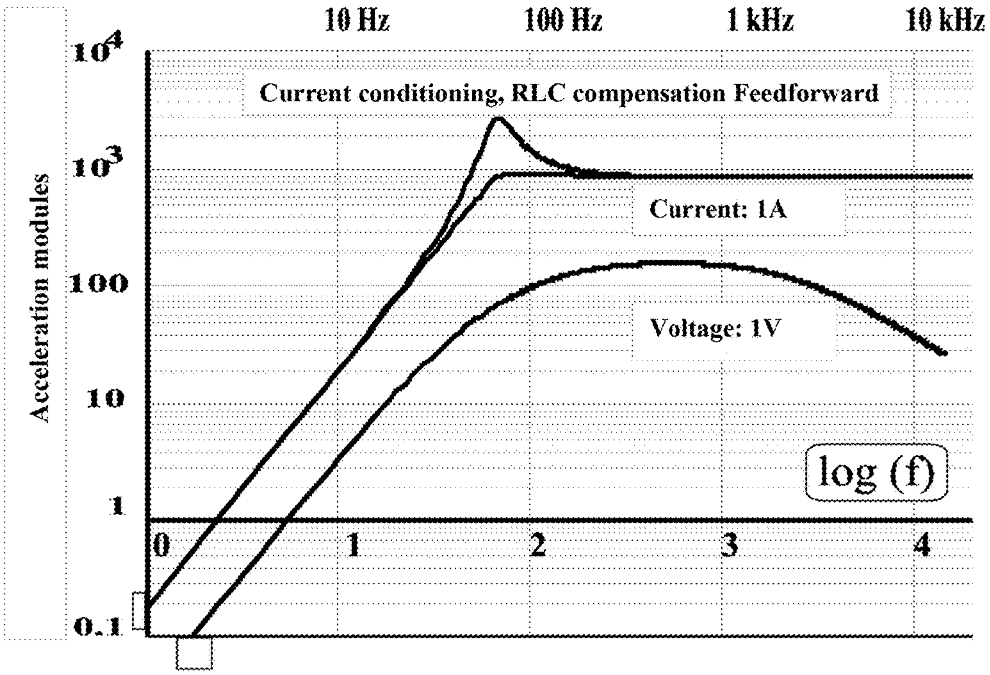
Figure 9:
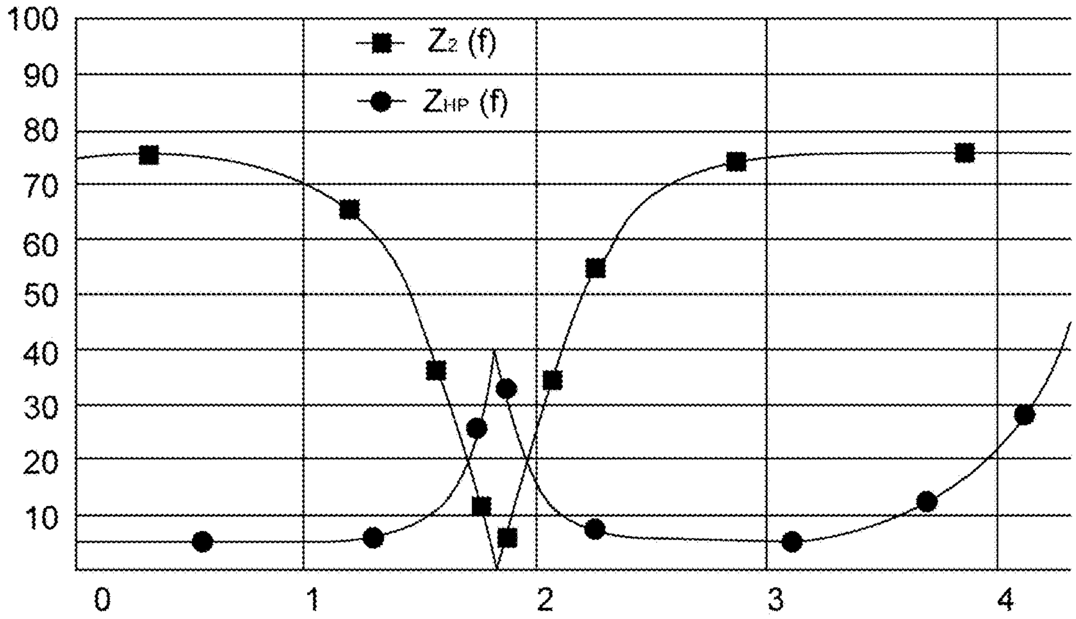

Other advantages and features of the invention will appear upon reading the detailed description of implementations and embodiments, in no way limiting, and the following accompanying drawings:

FIG. 1 illustrates a schematic representation of an acoustic signal supply circuit of at least one loudspeaker, said circuit being provided with a filtering device of the resonance peak according to a first embodiment of the present invention, FIG. 2 illustrates a schematic representation of a circuit including a non-inverting converter, this converter which may be part of an acoustic signal supply circuit of at least one loudspeaker according to the present invention, FIG. 3 illustrates the first embodiment of the filtering device of the acoustic signal supply circuit shown in FIG. 1, this device being shown in this enlarged figure relative to FIG. 1, FIG. 4 shows the curves of acceleration modules during a current control respectively with or without filter of the resonance peak as well as during a voltage control of a loudspeaker, the filtering being performed with a filtering device according to the first embodiment of the invention, FIGS. 5 and 5*a* respectively show curves of impedance modules and degrees of angle depending on the frequencies, the filtering being performed with a filtering device according to the first embodiment of the invention, FIG. 6 illustrates a schematic representation of a acoustic signal supply circuit of at least one loudspeaker, said circuit being provided with a filtering device of the resonance peak according to a second embodiment of the present invention, FIG. 7 illustrates the second embodiment of the filtering device of the acoustic signal supply circuit shown in FIG. 6, the filtering device being shown in this figure expanded compared to FIG. 6, FIG. 8 shows the curves of acceleration modules during a current control respectively with or without filter of the resonance peak as well as during a voltage control of a loudspeaker, the filtering being performed with a filtering device according to the second embodiment of the invention, FIG. 9 shows the curves of impedance modules respectively compared of the filtering device according to the second embodiment of the invention and loudspeaker.

According to the present invention, an ideal current control solution would be to find a filtering method to filter the two effects, namely the resonance peak and the loudspeaker directivity effect without altering the current control index also known as CDI. According to the present invention, it is possible to filter only the resonance peak retaining optimally the current control index.

Applying a filter to a current control of a loudspeaker rules out any filtering structure disposed in parallel with the loudspeaker due to the finite impedance character, even of low value in terms of source according to Thevenin. This may adversely affect the index CDI so crippling a useful part of the spectrum.

As the correction of the resonance peak of the clearly comes from the intrinsic behavior of the transducer acting as loudspeaker, the present invention provides a passive solution for the downstream correction of the at least one loudspeaker.

Thus with particular reference to FIGS. 1, 3, 6 and 7, the present invention relates to a current control method for an acoustic signal supply circuit of at least one loudspeaker HP incorporating a filtering device of the resonance peak of said at least one loudspeaker, in which method a correction step of the resonance peak is performed by the filtering device, said correction step being performed downstream of said at least one loudspeaker HP.

Said at least one HP loudspeaker having a diaphragm, it is advantageously performed, simultaneously to the filtering of the resonance peak, a reduction in the level of sound in the highest frequencies in the direction of the perpendicular axis of the diaphragm of said at least one loudspeaker HP. Thus, the two main disadvantages of current control are treated simultaneously.

Advantageously, the reduction in sound level is performed upstream of said at least one loudspeaker HP. Indeed, this correction of the sound level comes from a physical acoustic phenomenon related to the loudspeaker HP environment and falls within the handling of a systematic error which may consist in an upstream correction of the loudspeaker, also known as "feedforward correction". This has the advantage of not altering the properties of the current voltage conditioning.

Advantageously, the total resonance factor of the loudspeaker HP and the filtering device assumes the value of a Butterworth filter, which will be detailed later.

In the most general form of the present invention, it relates to an acoustic signal supply circuit of at least one loudspeaker HP incorporating a filtering device of the resonance peak of said at least one loudspeaker HP occurring at a given frequency, said circuit comprising at least one non inverting converter $A_0$ arranged upstream of said at least one loudspeaker HP having a positive supply terminal connected to the circuit input and to a negative supply terminal.

The circuit also includes at the output of the at least one loudspeaker HP a first instrumentation ground circuit bypassing a feedback loop connecting a circuit point downstream of said at least one loudspeaker HP to the negative supply terminal of the non inverting converter $A_0$, the resonance peak occurring at a given frequency of the supply current of the at least one loudspeaker HP.

According to an essential feature of the invention, a filtering device of the resonance peak of said at least one loudspeaker HP is incorporated either into the first instrumentation ground circuit GND.a or into the feedback loop, this filtering device being purely electrical in the form of an impedance, namely $Z_b$ shown in FIGS. 1 and 3, or $Z_2$ shown in FIGS. 6 and 7. This impedance $Z_b$ or $Z_2$ is incorporated into the first instrumentation ground circuit GND.a, as shown in FIGS. 1 and 3, or into the feedback loop, as shown in FIGS. 6 and 7. The parameters of the impedance $Z_b$ or $Z_2$ are predetermined as a function of the resonance peak to be filtered of said at least one loudspeaker HP.

Thus, the filtering device is located downstream of the loudspeaker HP in both preferred embodiments that will be detailed below.

In the first preferred embodiment shown in FIGS. 1 and 3, the filtering device is incorporated in the first instrumentation ground circuit GND.a.

As shown in FIG. 2 which illustrates a non-inverting converter with a resistor $R_A$ provided between the output of the non inverting converter $A_0$ and the feedback loop to the pole of converter $A_0$ and a resistor $R_B$ in an instrumentation ground circuit bypassing the feedback loop, when the converter input voltage is $V_{IN}$ and its output voltage is $V_0$, we can write:

$$V_o = \left(1 + \frac{R_A}{R_B}\right) \cdot V_{in} = (R_A + R_B) \cdot I \text{ as } I = \frac{V_{in}}{R_B}$$

By comparing this equation to the equation (12)

$$\left[\frac{X}{E}\right]_p = \left[\frac{X}{I}\right]_p \cdot \left[\frac{I}{E}\right]_p = \frac{B_l}{M_m} \cdot \frac{1}{P_1} \cdot \frac{1}{Z_{HP}} \tag{12}$$

and by generalizing the resistor $R_B$ to an impedance denoted $Z_b$, in terms of transfer functions, it then appears:

$$\left[\frac{I}{E}\right]_p = \frac{I}{V_{in}} = \frac{1}{Z_b} \quad (13)$$

with, in addition:

$$\left[\frac{X}{I}\right]_p = \frac{B_l}{M_m} \cdot \frac{1}{P_1} où\ P_1 = \left(p^2 + \frac{2}{\tau} \cdot p + \omega_0^2\right) \quad (6)$$

as was stated in the equation (6, the voltage control is subject to:

$$\left[\frac{X}{E}\right]_p = \left[\frac{X}{I}\right]_p \cdot \left[\frac{I}{E}\right]_p = \frac{B_l}{M_m} \cdot \frac{1}{P_1} \cdot \frac{1}{Z_{HP}} \quad (12)$$

For a control signal denoted E, imposed at the input of the current voltage converter $A_0$, the current control falls within a behavior such as:

$$\left[\frac{X}{E}\right]_p = \left[\frac{X}{I}\right]_p \cdot \left[\frac{I}{E}\right]_p = \frac{B_l}{M_m} \cdot \frac{1}{P_1} \cdot \frac{1}{Z_b} \quad (14)$$

A purely electrical correction can therefore be conceived by identifying at $Z_{HP}$ of equation (12) the constituent parameters of $Z_b$ in equation (14) so that the resonance peak is completely filtered in the same manner as the correction introduced by equation (12).

As shown in FIG. 3, the impedance $Z_b$ of the filtering device is in the form of an dead resistor $R_0$ associated with a first parallel impedance called RLC $Z_{bb}$. This first impedance comprises at least one first resistor $R_b$, at least one first inductor $L_b$ and at least one first capacitor $C_b$ arranged in parallel to each other, the first parallel RLC impedance $Z_{bb}$ being arranged in series with the dead resistor $R_0$ in said first instrumentation ground circuit.

FIG. 3 illustrates the elements leading to the development of a resonance compensation factor using a parallel RLC filter arranged in series with a dead resistor $R_0$.

It may be suitable to build a behavior relationship identifiable to equation (7a):

$$Z_{HP} \approx R_e + \frac{B_l^2}{M_m} \cdot \frac{p}{P_1} = \frac{R_e \cdot M_m \cdot P_1 + B_l^2 \cdot p}{M_m \cdot P_1} \quad (7a)$$

It is indeed possible to equalize respectively the polynomials $P_1$ and the denominator associated with the impedance $Z_{bb}$ in terms of the two following criteria $C_1$ and $C_2$:

$$C_1\text{: } \omega_0^2 = \frac{k_m}{M_m} = \frac{1}{L_b \cdot C_b} \text{ and} \quad (15 \text{ and } 15a)$$

$$C_2\text{: } \frac{f_m}{M_m} = \frac{1}{R_b \cdot C_b}$$

$F_m$, $k_m$ and $M_m$ having been defined in equation (5) and being predetermined parameters of the loudspeaker.

Thus, the values of said at least one first capacitor $C_b$, of said at least one first resistor $R_b$, and of said at least one first inductor $L_b$ are calculated according to the loudspeaker parameters, namely the $f_m$:$M_m$ ratio representative of the mitigation and the $k_m$:$M_m$ ratio representative of the square of the resonance angular frequency of the loudspeaker HP according to the following equations:

$$f_m/M_m = 1/R_b \cdot C_b \quad (16)$$

$$k_m/M_m = 1/L_b \cdot C_b \quad (16a)$$

Considering now the connection in series of the parallel network RLC to the resistor $R_0$, a grouping identical to that which leads to equation (7b) allows writing the transfer function in displacement:

$$\left[\frac{X}{E}\right]_p = \frac{B_l}{M_m \cdot R_0} \cdot \frac{1}{\left[p^2 + \left(\frac{f_m}{M_m} + \frac{1}{R_0 \cdot C_b}\right) \cdot p + \omega_0^2\right]} = \frac{B_l}{M_m \cdot R_0} \cdot \frac{1}{W_1} \quad (17)$$

This association has a composite resonance factor denoted $Q_{HP+Zb}$ between the mechanical factor in the equation (9) denoted $Q_m$ and a purely electrical factor $Q_{Zb}$ such that:

$$\frac{1}{Q_{HP+Zb}} = \frac{1}{Q_m} + \frac{1}{Q_{Zb}} avec\ Q_{HP+Zb} = \frac{\sqrt{k_m / M_m}}{f_m / M_m + 1 / R_0 \cdot C_b} \quad (18)$$

$$\text{soit si } f_m \to 0\text{, alors: } Q_{Zb} = R_0 \cdot C_b \cdot \sqrt{k_m / M_m} \quad (19)$$

[so if . . . then:]

After choosing the inductor values $L_b$ and of capacitor $C_b$ with regard to the criteria $C_1$ and $C_2$, an idealized behavior may be considered in choosing to arrange the resistor $R_0$ such that the overall resonance factor takes an optimum value, that of a Butterworth filter corresponding to $Q_{HP+Zb}+1\sqrt{2}$.

Thus:

$$R_0 = \frac{1}{C_b} \cdot \frac{1}{\sqrt{2 \cdot k_m / M_m} - f_m / M_m} \quad (20)$$

In the first preferred embodiment shown in FIGS. 1 and 3, the filtering device is therefore incorporated into the first instrumentation ground circuit GND.a. As previously mentioned, depending on the input voltage $V_{in}$ of the circuit, the current I flowing in the first instrumentation ground circuit GND.a through the impedance $Z_b$ is defined by $I=V_{in}/Z_b$. The current $I_f$ running through the converter feedback loop may be equal to 0.

A non-limiting and purely illustrative example for a loudspeaker will now be given. The selected loudspeaker is Morel EM 428 with the following parameters: $L_e$=0.36 mH, $R_e$=5.4Ω, Bl=5.4 T.m, $M_m$=6.55 g, $k_m$=1136 N/m, $f_m$=0.86 kg/s, Resonance $F_0$=66.29 Hz The resonance, mechanical, electrical and combined factors, measured and theoretical, are respectively, the theoretical factor being that between parenthesis, Qm 3.03 (3.17), Qe 0.48 (0.505), Qm+e 0.41 (0.436).

As defined above, the application of the criterion $C_1$ on the resonance frequency is to be considered depending on the availability and price of the respective two components: the one or more inductor(s), advantageously chokes wire-wound on air, and the one or more bipolar capacitor(s).

To first order, the choice of a choke of $L_b$=12 mH requires a capacity of $C_b$=480 μF to cover the resonant frequency of 66.3 Hz. However, such a choice may be discussed, in terms of price and components-specific defects, in the light of possible combinations, including with, possibly, a choke n times weaker associated with n capacitors arranged in parallel.

The application of the criterion $C_2$ on the equivalence of relaxation times leads to a resistor value of $R_b$=15.8Ω. Finally, equation (20) leads to the selection of a series resistor of $R_0$=4.55Ω. Without prejudice to their ability to dissipate heat resulting from an operational system with the transducer, such components are readily available commercially.

To simplify notation, the reasoning focused on the displacement function, but it is the acceleration that should be the focus as to the acoustic result.

It is important to maintain the system stability, whatever the operating regime of the combination converter and said at least one loudspeaker. The impedance relationship representative of the phase shift between the signals does not present a phase difference close to 180°, which could cause the oscillation of the amplifier.

FIG. 4 illustrates the curves of the acceleration modules during a current control with or without filter of the resonance peak as well as during a voltage control of a loudspeaker, filtering being performed with a filtering device according to the first embodiment of the invention. The intermediate curve is the curve with current control and filtering with a filtering device according to the first embodiment and shows the absence of a resonance peak unlike the upper curve with current control without filtering. In addition, the intermediate curve has a substantially constant acceleration module range, wider than that of the lower curve which is the curve with voltage control.

In FIGS. 5, 5*a* for the loudspeaker taken as an example, the curves of impedance modules $Z_{HP}$, $Z_{bb}$ and $Z_b$, and their degrees of angle depending on the frequency, were traced respectively in a comparative manner. The curve for module $Z_{HP}$ is the one with rectangles, that for $Z_{bb}$ with lozenges, and that for Zb with circles. The curves shown in FIG. 5*a* thus show that the phase shift angle remains within a range of perfectly permissible values, preferably from −40° to +40°, on the frequency domain considered.

The second embodiment of the filtering device provides for its incorporation into the feedback loop of inverter $A_0$. This is shown in FIGS. 6 and 7.

The filtering device is incorporated into the feedback loop and is in the form of a second impedance $Z_2$ comprising a second resistor $R_2$ coupled in parallel with at least one second inductor $L_2$ and at least one second capacitor $C_2$, said at least one second inductor $L_2$ and said at least one second capacitor $C_2$ are arranged in series.

Compared to the first embodiment which required the passage of a strong current in the filter $R_0$, $R_b$, $L_b$, $C_b$ as shown in FIG. 1, the second embodiment avoids this disadvantage by choosing to have the filtering device in the feedback loop of the converter $A_0$.

In this second embodiment, shown in FIGS. 6 and 7, wherein a second instrumentation ground circuit is arranged between the second impedance $Z_2$ and the converter $A_0$, the first and second instrumentation ground circuits respectively incorporate a first dead resistor $R_B$ for the first instrumentation ground circuit GND.a and a second dead resistor $R_3$ to the second instrumentation ground circuit.

$V_{in}$ being the input voltage of the circuit, $V_0$ the output voltage of converter $A_0$ and $V_f$ the voltage in the bypass loop, we can define a factor β such that:

$V_f=\beta V_0$ et $V_0=1/\beta V_{in}$

The current $I_f$ returning to the negative pole of the converter after bypassing the second instrumentation ground circuit may be equal to 0.

Another conventional calculation shows that the transconductance is then defined by:

$$\frac{I}{V_{in}} = \frac{1}{R_B}\cdot(1+(Z_2+R_B)/R_3) \tag{21}$$

Referring to all equations mentioned above, it is possible to calculate the second impedance $Z_2$, the mechanical resonance factor of the impedance $Z_2$ and the initial angular speed $\omega_0$:

$$Z_2 - \frac{p^2\cdot R_2 + R_2/L_2C_2}{p^2 + \frac{R_2}{L_2}\cdot p + 1/L_2C_2}$$

$$\omega_0 = \frac{1}{\sqrt{L_2\cdot C_2}}$$

$$Q_{Z2} = \frac{1}{R_2}\cdot\sqrt{\frac{L_2}{C_2}}$$

A calibration may be performed first with the choice of $R_B$, then $R_2$ much higher than $R_B$, since $R_2$ determines the generic behavior outside the resonance. The quality coefficient of this filter structure, however, requires an inductor value much higher than that defined for the above solution.

For example, without being exhaustive, the calibration of the device can be achieved based on the value of the first dead resistor $R_B$, the value of the second resistor $R_2$ of the second impedance $Z_2$ being determined based on the value of the first dead resistor $R_B$ by being 10 to 100 times greater than the value of the first dead resistor $R_B$, the value of the second dead resistor $R_3$ being 2 to 30 times greater than the value of the first dead resistor $R_B$.

Furthermore, depending on the structure of the converter $A_0$, the $R_B$ value must not advantageously be too high to maintain stability. For the loudspeaker used as an example, with a unit value of $R_B$, the behaviors of the filtering device and the transconductance are illustrated in FIG. 8. At the resonance frequency, the phase paths emphasize the phase rotation presented by $Z_2$ and the symmetry observed by transconductance compared with the transducer.

The component values shown in the figure are adjusted to respond to an electric quality factor of the order of 0.45 for a correct association with the resonance of the transducer.

For a control voltage denoted E soliciting the entry of the conditioner and considering the last elements presented assigned their respective values, the acceleration behavior resulting from the arrangement is expressed:

$$\left[\frac{A}{E}\right]_p = p^2\cdot\left[\frac{X}{E}\right]_p = p^2\cdot\left[\frac{X}{I}\right]_p\cdot\left[\frac{I}{E}\right]_p = p^2\cdot\frac{B_l}{M_m}\cdot\frac{1}{P_1}\cdot\frac{1}{R_B}\cdot(1+(Z_2+R_B)/R_3) \tag{22}$$

In this notation, E has a unit value. A gain or attenuation can allow an adjustment, either by adding a stage upstream of the conditioner, or by changing the value of the resistor $R_B$ subject not to alter the stability depending on the amplifier used.

In the figures, it should be noted that the loudspeaker taken as an example has a moderate mechanical resonance factor value of $Q_m \approx 3$, value low enough to allow the proposed adjustment. The calculation shows that for a $Q_m$ value greater than 8, for example a loudspeaker Pioneer® TS-123, the mode of application of this correction are more demanding. In fact, for the chosen example, this solution requires an inductor of 80 mH, value can be crippling for a winding on air. An artificial choke assembly, in particular with gyrating devices, may nevertheless be envisaged, an inductor variation being thus easily obtained.

Another non-limiting example can also be given for a loudspeaker having the following characteristics: $B_l$=2.675 Tm, $M_m$=3.67 g, $f_m$=0.539 N/m, $k_m$=5650 N/m, resonance frequency=197 Hz, $R_e$=3.655Ω, L=0.12 mH.

In this case, according to the first embodiment of the filtering device, the relationship concerning criteria $C_1$ and $C_2$ leads for example to $L_b$=2.2 mH, $C_b$=295 μF, $R_b$=23Ω. Similarly, the Butterworth equivalence results in: $R_0$=2.2Ω.

These values are not binding and even allow considering standard components. Finally, the overall result is idealized if the nominal current transconductance voltage conditioner is set at 2 A/V.

Advantageously, the chokes serving as inductors in the various embodiments described can be made of metals or light alloys other than copper, the main criterion being a good electrical conductivity.

FIG. 8 illustrates the current control curves with or without filtering of the resonance peak, as well as the voltage control curve of a loudspeaker, filtering being performed with a filtering device according to the second embodiment of the invention. The intermediate curve is the curve with current control and filtering with a filtering device according to the second embodiment and shows the absence of a resonance peak unlike the upper curve with current control without filtering. In addition, the intermediate curve has a substantially constant acceleration module range wider than that of the lower curve which is the curve with voltage control.

In FIG. 9, the respectively compared impedance module curves of the filtering device $Z_2$ and said at least one loudspeaker $Z_{HP}$ were traced for the loudspeaker used as an example. These impedance modules curves increase and decrease in opposition. The curve with rectangles illustrates the impedance curve $Z_2$ of the filtering device while the curve with the circles illustrates the impedance curve $Z_{HP}$ of the loudspeaker.

In what has been described above, at least one non-inverting converter was used in the circuit to simplify the calculations. This is not limitative and the present invention can however also be applied to a circuit comprising several non inverting converters as well as one or several inverting converters.

The market for audio reproduction, especially high-end reproduction, is directly concerned by filtering devices according to the present invention. The big brands, such as Bose®, Bang & Olufsen®, Harman Kardon®, B&W®, etc . . . should certainly be interested in the commercial distribution of such filtering devices.

The invention claimed is:

1. An acoustic signal supply circuit of at least one loudspeaker incorporating a filtering device of the resonance peak of said at least one loudspeaker occurring at a given frequency of the supply current of said at least one loudspeaker, said circuit comprising at least one non-inverting converter arranged upstream of said at least one loudspeaker having a positive supply terminal connected to the input power circuit and a negative supply terminal, said circuit comprising also, at the output of said at least one loudspeaker, a first instrumentation ground circuit bypassing a feedback loop connecting a point in the circuit downstream of the loudspeaker to the negative supply terminal of the non-inverting converter, the filtering device of the resonance peak of said at least one loudspeaker being purely electrical in the form of an impedance incorporated either in the first instrumentation ground circuit or in the feedback loop, the impedance parameters being predetermined as a function of the resonance peak to be filtered of said at least one loudspeaker, characterized in that:

when the impedance is incorporated into the first instrumentation ground circuit, this impedance is in the form of a dead resistor coupled with a first parallel impedance called RLC comprising at least one first resistor, at least one first inductor and least one first capacitor arranged in parallel to each other, the first parallel RLC impedance being arranged in series with the dead resistor in said first instrumentation ground circuit, and when the impedance is incorporated into the feedback loop, this impedance as the second impedance comprises a second resistor coupled in parallel with at least one second inductor and at least one second capacitor, said at least one second inductor and said at least one second capacitor being arranged in series.

2. The circuit according to the preceding claim, wherein, when the impedance is incorporated into the first instrumentation ground circuit, the values of said at least one first capacitor, said at least one first resistor and said at least one first inductor are calculated according to the parameters of the at least one loudspeaker, namely the $f_m$:$M_m$ ratio representative of mitigation and the $k_m$:$M_m$ ratio representative of the square of the resonance angular frequency of the at least one loudspeaker according to the following equations:

$$f_m/M_m = 1/R_b \cdot C_b$$

$$k_m/M_m = 1/L_b \cdot C_b.$$

3. The circuit according to claim 1, wherein the first parallel RLC impedance comprises n first inductors and n first capacitors, n being greater than or equal to one.

4. The circuit according to claim 1, wherein, when the value of said at least one second inductor exceeds a value of 50 mH, said at least one second inductor is in the form of artificial chokes provided with gyrating means.

5. A method of current control of an acoustic signal supply circuit of at least one loudspeaker incorporating a filtering device of the resonance peak of said at least one loudspeaker according to claim 1, in which method a correction step of the resonance peak by the filtering device is carried out, said correction step being carried out downstream of said at least one loudspeaker.

6. A control method according to the preceding claim, wherein the overall resonance factor of the loudspeaker and of the filtering device is set to a Butterworth filter.

7. A control method according to claim 5, wherein temperature variations of said at least one loudspeaker are taken into account by the filtering device by variation corresponding to the parameters of the impedance of said device.

* * * * *